(12) United States Patent
Masleid et al.

(10) Patent No.: US 8,436,668 B2
(45) Date of Patent: May 7, 2013

(54) MIN-TIME HARDENDED PULSE FLOP

(75) Inventors: Robert P. Masleid, Monte Sereno, CA (US); Jason M. Hart, Hayden, ID (US)

(73) Assignee: Oracle International Corporation, Redwood City, CA (US)

( * ) Notice: Subject to any disclaimer, the term of this patent is extended or adjusted under 35 U.S.C. 154(b) by 120 days.

(21) Appl. No.: 12/984,174

(22) Filed: Jan. 4, 2011

(65) Prior Publication Data

US 2012/0169392 A1     Jul. 5, 2012

(51) Int. Cl.
*H03K 3/356*     (2006.01)

(52) U.S. Cl.
USPC ........... 327/208; 327/210; 327/211; 327/212; 327/218; 326/93; 326/95; 326/98

(58) Field of Classification Search .......... 327/199–203, 327/208, 210–215, 218; 326/93–98
See application file for complete search history.

(56) References Cited

U.S. PATENT DOCUMENTS

| | | | | |
|---|---|---|---|---|
| 5,508,648 | A * | 4/1996 | Banik | 327/203 |
| 6,433,601 | B1 * | 8/2002 | Ganesan | 327/202 |
| 6,433,603 | B1 | 8/2002 | Singh | |
| 6,529,046 | B1 | 3/2003 | Shih | |
| 6,698,005 | B2 | 2/2004 | Lindkvist | |
| 7,049,871 | B2 * | 5/2006 | Tohsche | 327/197 |
| 8,181,073 | B2 * | 5/2012 | Vahidsafa et al. | 714/726 |
| 8,305,126 | B2 * | 11/2012 | Smith et al. | 327/202 |
| 2008/0141088 | A1 * | 6/2008 | Parulkar et al. | 714/729 |
| 2009/0108895 | A1 * | 4/2009 | Saint-Laurent et al. | 327/176 |
| 2010/0301915 | A1 * | 12/2010 | Hart et al. | 327/218 |

* cited by examiner

*Primary Examiner* — Patrick O'Neill
(74) *Attorney, Agent, or Firm* — Meyertons, Hood, Kivlin, Kowert & Goetzel, P.C.; Erik A. Heter

(57) ABSTRACT

A flop circuit is disclosed. The flop circuit includes an input circuit configured to hold a logic value of an input signal received on its input node. The flop circuit further includes a storage circuit configured to, responsive to a pulse clock transitioning to a first logic level, receive and store the logic value and a complement of the logic value. A transfer circuit is coupled between the input circuit and the storage circuit, wherein the transfer circuit is configured to transfer the logic value from the input circuit to the storage circuit responsive to the pulse clock transitioning to the first logic level. The transfer circuit includes a first float node and a second float node and is configured such that at least one of the float nodes is floating during a portion of the operational cycle of the flop circuit.

20 Claims, 8 Drawing Sheets

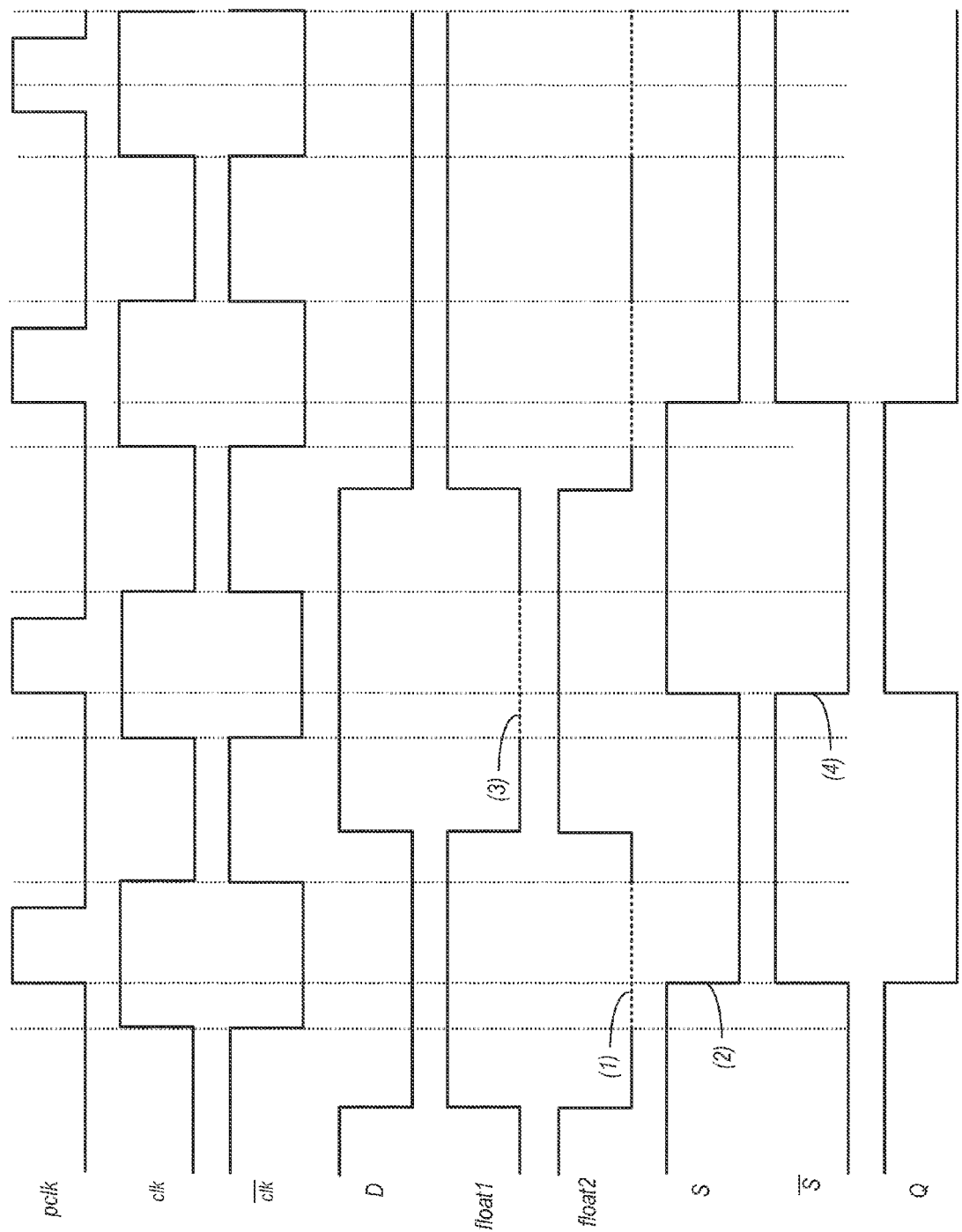

MIN-TIME HARDENED PULSE FLOP

BACKGROUND

1. Field of the Invention

This invention relates to electronic circuits, and more particularly, to flop circuits.

2. Description of the Related Art

Integrated circuits (ICs) may utilize a wide variety of different types of storage circuits. Commonly used storage circuits include master-slave flip-flops and latch circuits. Flip-flops and latches may be widely used to provide temporary storage of data states in an IC, e.g., for storing a state of a signal in transit between a first block of combinational logic and a second block of combinational logic.

Another type of storage circuit used in ICs is a pulse flop. A pulse flop may be formed by converting a single latch circuit to perform a flip-flop function using a pulse clock having a duty cycle of less than 50%. When the pulse clock is asserted (e.g., high), the pulse flop may be transparent, and thus a logic value on an input may be received and propagated to an output. When the pulse clock is not asserted (e.g., low), the logic value input may be blocked from propagating to the output, with the previously input logic value being stored.

While pulse flops may be useful in many situations, in particularly fast signal paths, the low delay of a pulse flop can result in a race condition. More particularly, in a path having a low delay, a logic value may propagate through two or more pulse flops that are coupled together serially during the transparency phase of the pulse clock (this is sometimes referred to as the "min-delay" or "min-time" problem). This may result in erroneous operation of the IC in which the pulse flops are implemented. To overcome this problem, a standard edge-triggered master-slave flip-flop may be introduced into the signal path in place of one or more of the pulse flops.

SUMMARY OF THE DISCLOSURE

A flop circuit is disclosed. In one embodiment, the flop circuit includes an input circuit having an input node, wherein the input circuit is configured to hold a logic value of an input signal received on the input node. The flop circuit further includes a storage circuit configured to, responsive to a pulse clock transitioning to a first logic level, receive and store the logic value and a complement of the logic value. A transfer circuit is coupled between the input circuit and the storage circuit, wherein the transfer circuit is configured to transfer the logic value from the input circuit to the storage circuit responsive to the pulse clock transitioning to the first logic level. The transfer circuit includes a first float node and a second float node and is configured such that at least one of the float nodes is floating during a portion of the operational cycle of the flop circuit.

An integrated circuit (IC) is also disclosed. In one embodiment, an IC includes first and second logic units each having one or more combinational logic circuits and a flop circuit coupled between the first and second logic units. The flop circuit is coupled to receive a first signal from the first logic unit and is configured to provide a second signal to the second logic unit in accordance with a pulse clock. The flop circuit includes an input circuit, a storage circuit, and a transfer circuit. The input circuit includes an input node coupled to receive the first signal and is configured to hold a logic value of the first signal. The storage circuit is configured to, responsive to the pulse clock transitioning to a first logic level, receive and store the logic value of the first signal and a complement of the logic value of the first signal. The transfer circuit is coupled between the input circuit and the storage circuit, and is configured to transfer the logic value of the first signal from the input circuit to the storage circuit responsive to the pulse clock transitioning to the first logic level. The transfer circuit includes a first float node and a second float node and is configured such that at least one of the float nodes is floating during a portion of the operational cycle of the flop circuit.

BRIEF DESCRIPTION OF THE DRAWINGS

Other aspects of the invention will become apparent upon reading the following detailed description and upon reference to the accompanying drawings in which:

FIG. 8 is a timing diagram illustrating operation of the embodiment of the pulse flop circuit of FIG. 7.

Figure 1:
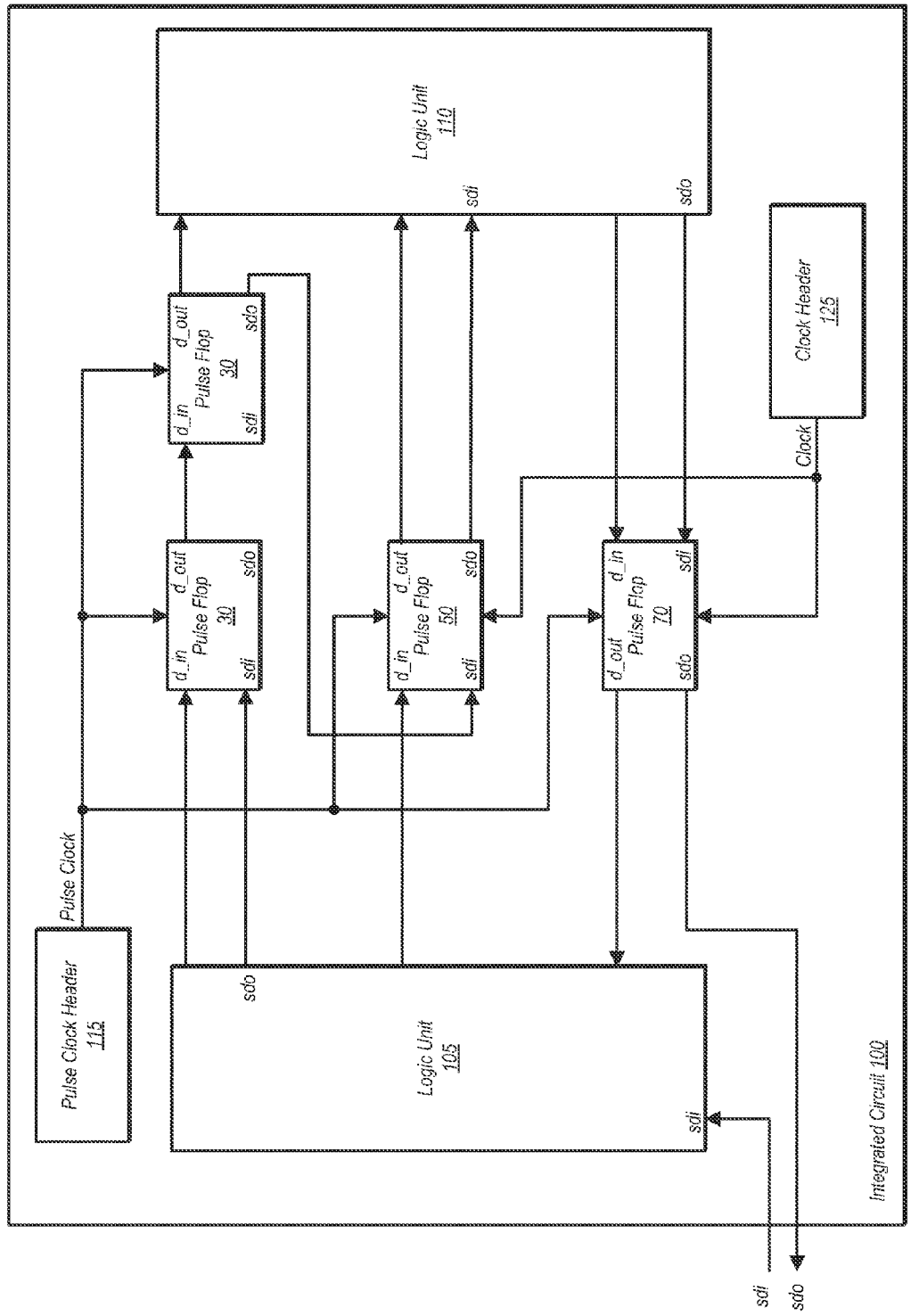
FIG. 1 is a block diagram of one embodiment of an integrated circuit (IC)

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Integrated Circuit and Pulse Flop Block Diagrams

Turning now to FIG. 1, a block diagram of one embodiment of an integrated circuit (IC) is shown. The block diagram of IC 100 is exemplary and is intended to illustrate certain aspects of the disclosure, but it is noted that it is not intended to be limiting. Thus, actual implementations of IC 100 may include components that are not explicitly shown or discussed herein.

IC 100 in the embodiment shown includes a first logic unit 105 and a second logic unit 110. Each of these logic units may include various combinational logic circuitry. Logic units 105 and 110 in the embodiment shown are coupled for communications with each other through various pulse flops. Using the pulse flops, the communications may be synchronized with respect to a pulse clock, a clock (e.g., a regular clock having a 50% duty cycle), or both. Various types of pulse flops may be used to facilitate such communications.

A first communications path from logic unit 105 to logic unit 110 is provided through a series of two pulse flops 30 in the embodiment shown. Each of pulse flops 30 in the embodiment shown is coupled to receive a pulse clock, but no other clock. The pulse clock may be generated and provided by pulse clock header 115. The pulse clock may be a clock that has less than a 50% duty cycle. Pulse flops 30 may each be transparent for the duty cycle (e.g., when the pulse is asserted high), but may otherwise block signal transmissions during the remainder of the cycle. As will be explained in further detail below, pulse flops 30 may be configured to prevent the min-time problem wherein the state of a signal might otherwise pass through two or more pulse flops when both are transparent (e.g., when the pulse is asserted in this example).

In the example shown, a second communications path from logic unit 105 to logic unit 110 is provided by pulse flop 50. A third communications path operable to convey signals from logic unit 110 to logic unit 105 is provided by pulse flop 70. Pulse flops 50 and 70 are each coupled to receive both the pulse clock and a 50% duty cycle clock signal ('Clock'). The 50% duty cycle clock signal may be generated and provided by clock header 125. In some embodiments, the clock signal provided to pulse flops 50 and 70 may be a complementary clock signal, i.e. one which has a 180° phase difference from the 50% duty cycle clock signal that is provided to other components. Pulse flops 50 and 70 may be synchronized in operation by both the pulse clock and the 50% duty cycle clock, or complement thereof, as will be discussed below.

In the embodiment shown, IC 100 is operable to support scan testing, including both a scan data input and a scan data output. A scan chain may be formed through logic units 105 and 110 and the various scan pulse flops. It is noted however that the circuitry to support scan testing is optional, and other embodiments are possible and contemplated wherein scan testing is not supported.

Figure 2:
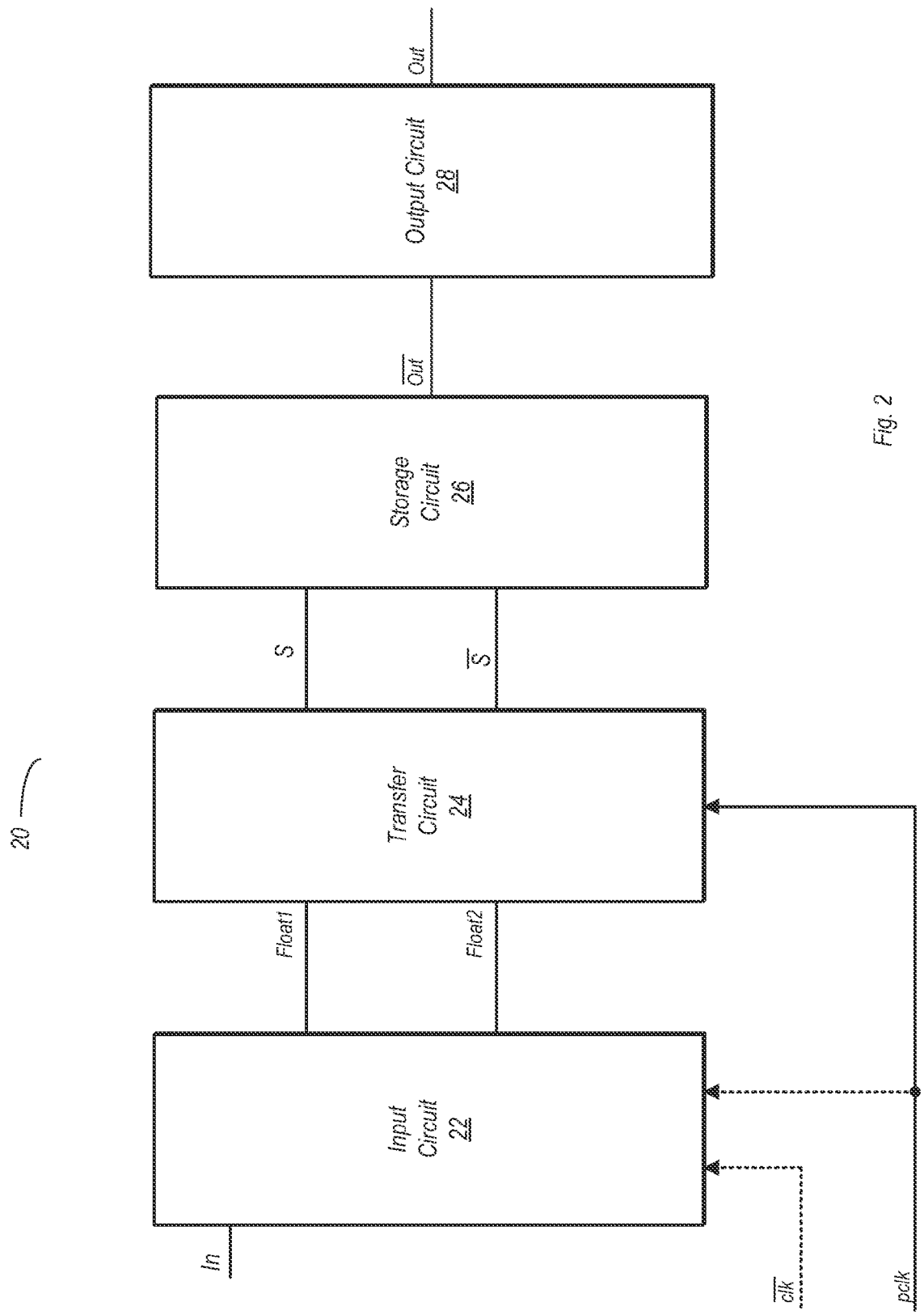
FIG. 2 is a block diagram of one embodiment of a pulse flop circuit.

FIG. 2 is a block diagram of one embodiment of a pulse flop. More particularly, pulse flop 20 in the embodiment shown may be used to illustrate the basic organization of pulse flops 30, 50, and 70 as introduced above and to be discussed further below.

Pulse flop 20 in the embodiment shown includes an input circuit 22, a transfer circuit 24, a storage circuit 26, and an output circuit 28. In some embodiments, input circuit 22, may be coupled to receive a complement of a clock signal, $\overline{clk}$, wherein the complement of the clock signal (like its true counterpart) has a 50% duty cycle. In other embodiments, input circuit may be coupled to receive a pulse clock signal, pclk, in which the duty cycle is less than 50%. Incoming data may be received by input circuit on the input node ('In').

Input circuit 22 in the embodiment shown is coupled to transfer circuit 24 via first and second float nodes, float1 and float2. These circuit nodes are labeled as such in this embodiment because at least one may "float" during at least a portion of the operational cycle of pulse flop 20. As used herein, the term "float" with respect to a node may refer to a time during the operation when the node is not being actively driven by either a PMOS (p-channel metal oxide semiconductor) or NMOS (n-channel metal oxide semiconductor) device. Similarly, a float node may be defined as a node that is not actively driven by any device for a portion of an operational cycle of the pulse flop. Accordingly, any voltage on that particular float node may be held capacitively for a time, although it is possible for the voltage to decay on the node if it is not actively driven after a certain time. However, since pulse flop 20 may be designed for fast operation, the amount of time necessary for a float node to hold a voltage may be relatively small, thereby enabling the activation of other devices dependent on receiving a voltage from that node. Furthermore, in implementing pulse flops using the float node, circuit area may be saved since extra transistors are not required to drive these nodes. This may also reduce delays through the circuit.

Transfer circuit 24 in the embodiment shown is coupled to receive the pulse clock signal, pclk. Responsive to a transition of the pulse clock to its active phase (e.g., from low to high), transfer circuit 24 may activate in order to transfer the logical value of the input signal, as well as its complement, to storage circuit 26. The complement of the input data may be conveyed on one of the float nodes (e.g., float1) while the true input data may be conveyed on the other one of the float nodes (e.g., float2).

Storage circuit 26 is configured to store the state of the input data signal and its complement, and may continue to store these values subsequent to deactivation of transfer circuit 24. Output circuit 28 in the embodiment shown is coupled to receive a complement of the output signal, $\overline{out}$, and is configured to drive the true output signal, out, on its output node. It is noted that in some embodiments the output signal may be a complement of the input signal.

Figure 3:
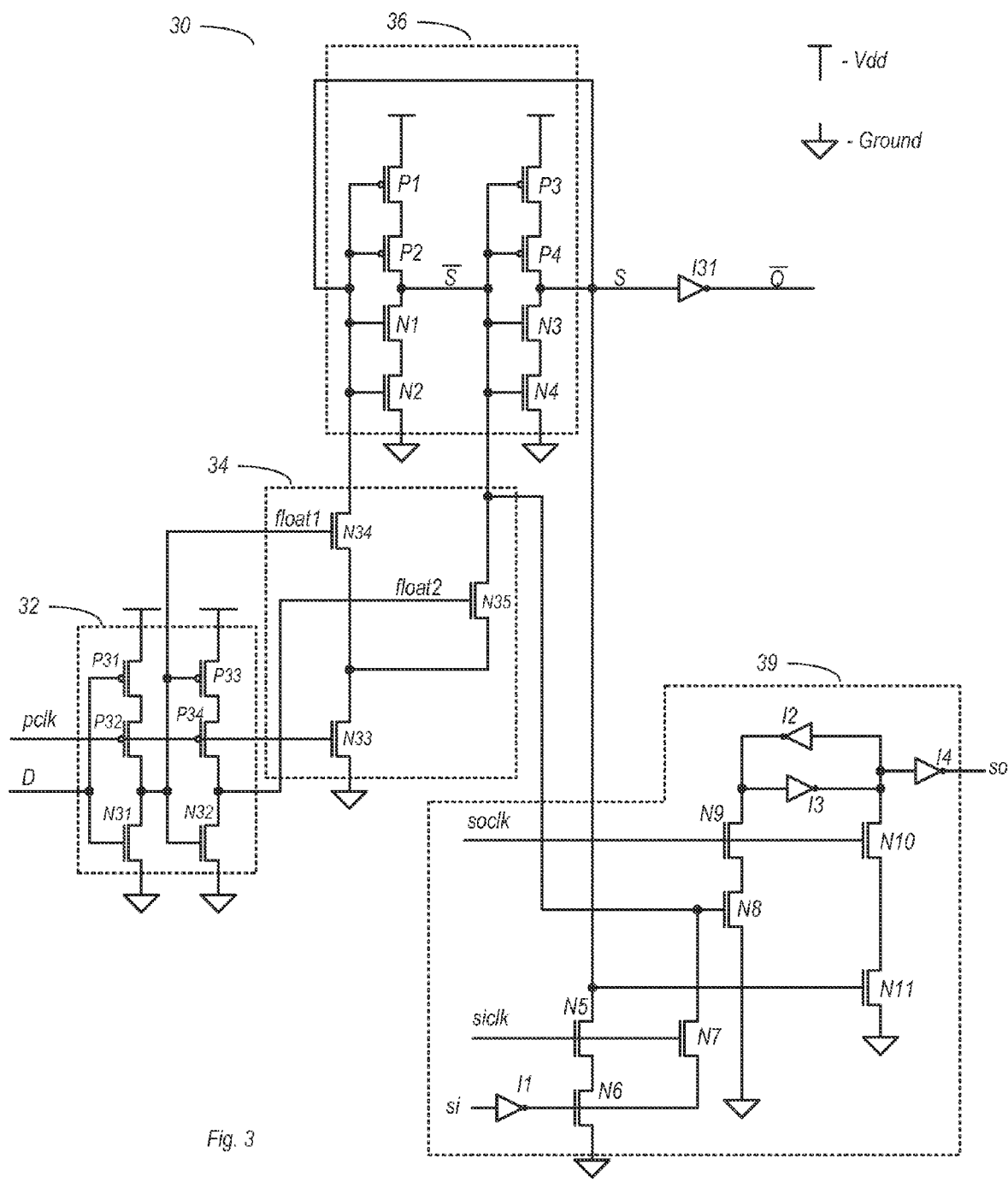
FIG. 3 is a schematic diagram of one embodiment of a pulse flop circuit.
Figure 4:
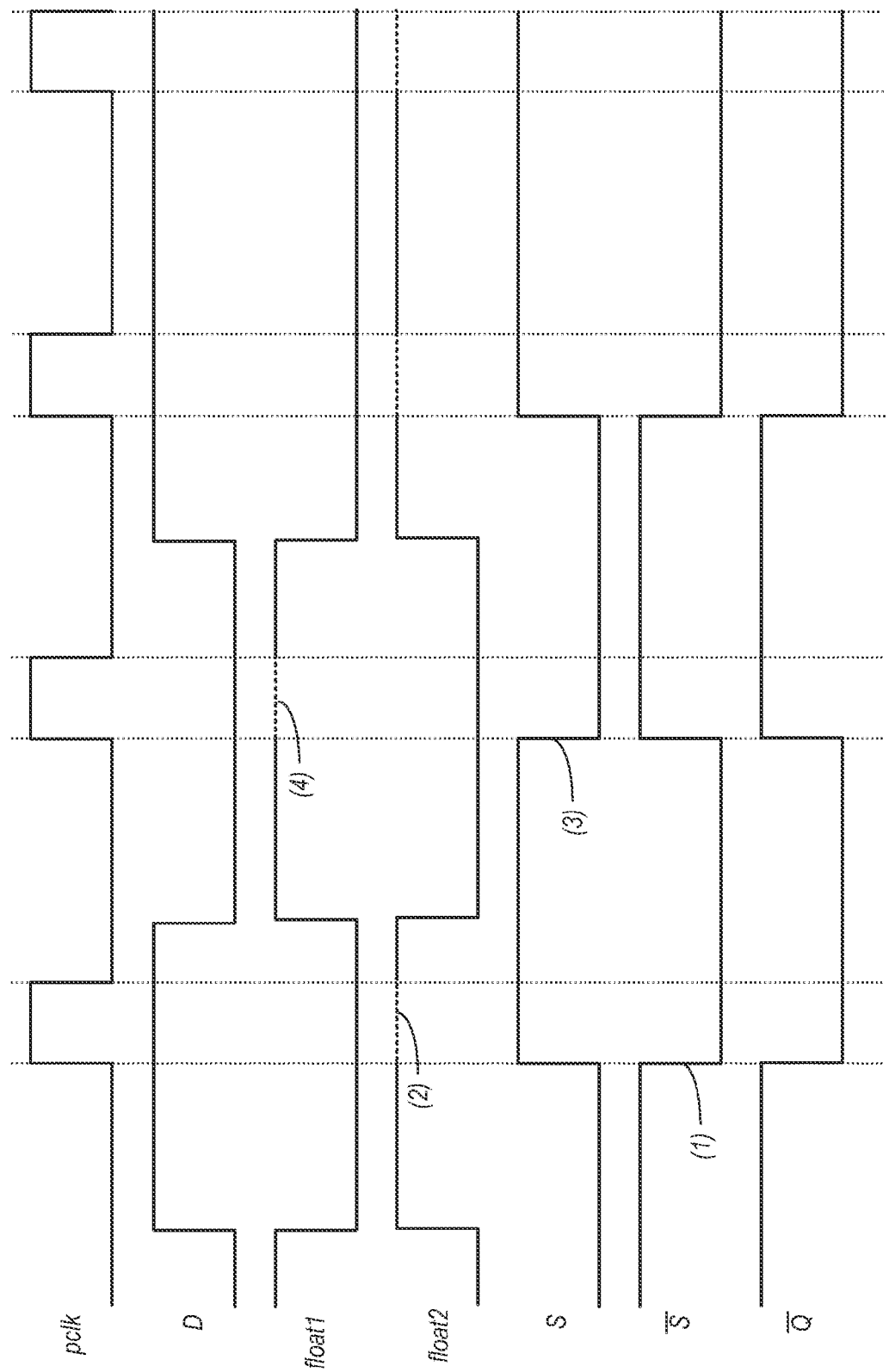
FIG. 4 is a timing diagram illustrating operation of the embodiment of the pulse flop circuit of FIG. 3.
Figure 5:
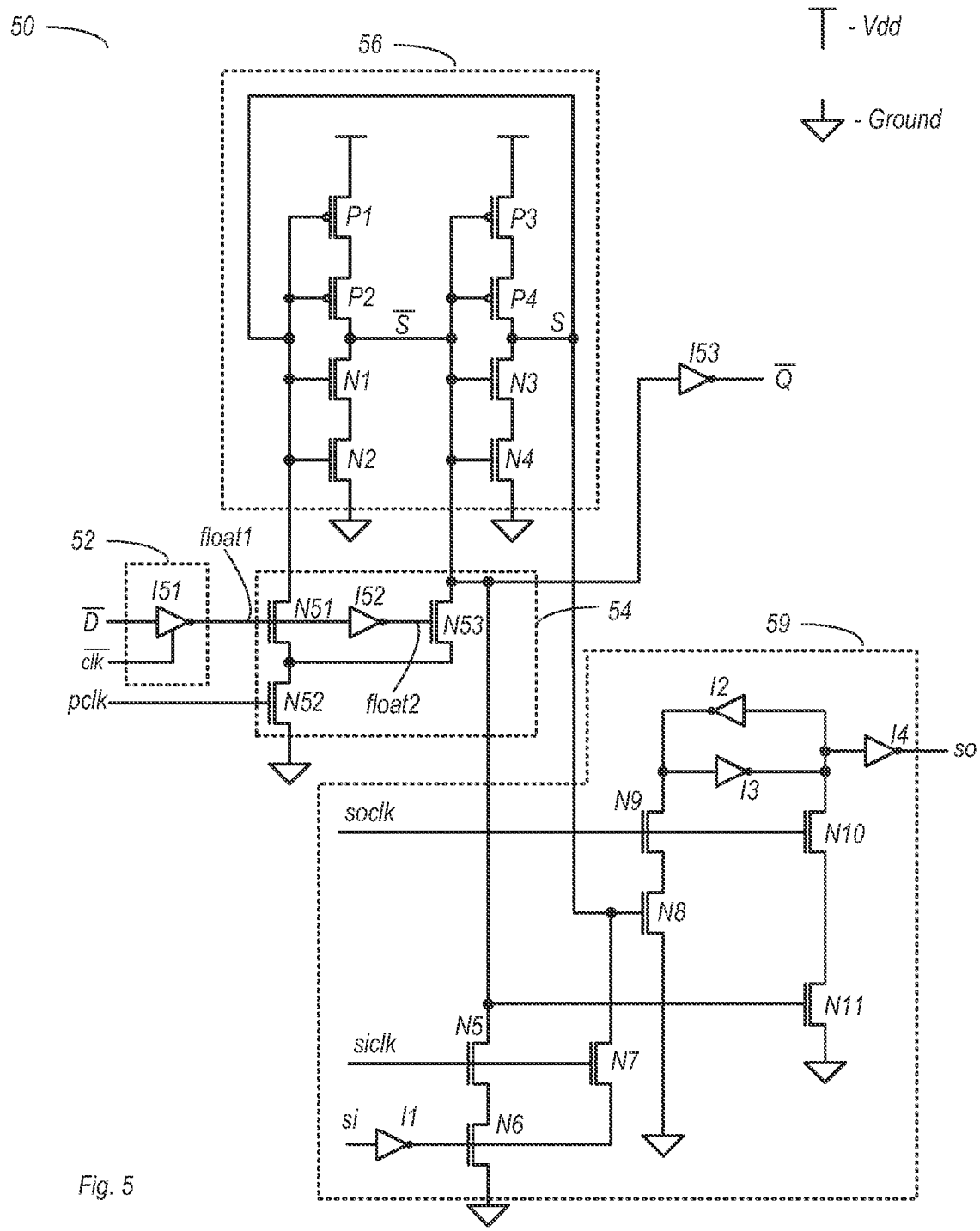
FIG. 5 is a schematic diagram of another embodiment of a pulse flop circuit.
Figure 6:
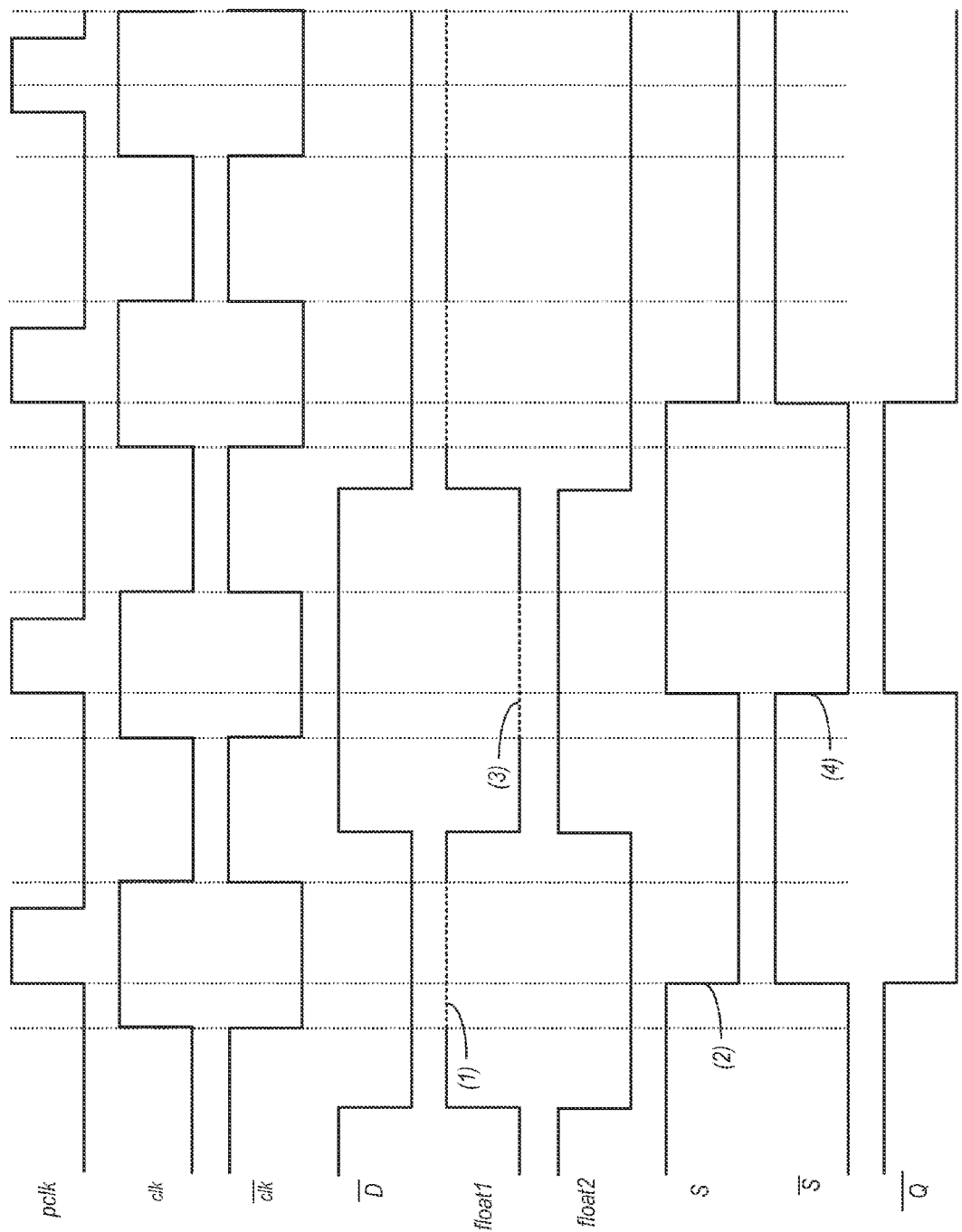
FIG. 6 is a timing diagram illustrating operation of the embodiment of the pulse flop circuit of FIG. 5.
Figure 7:
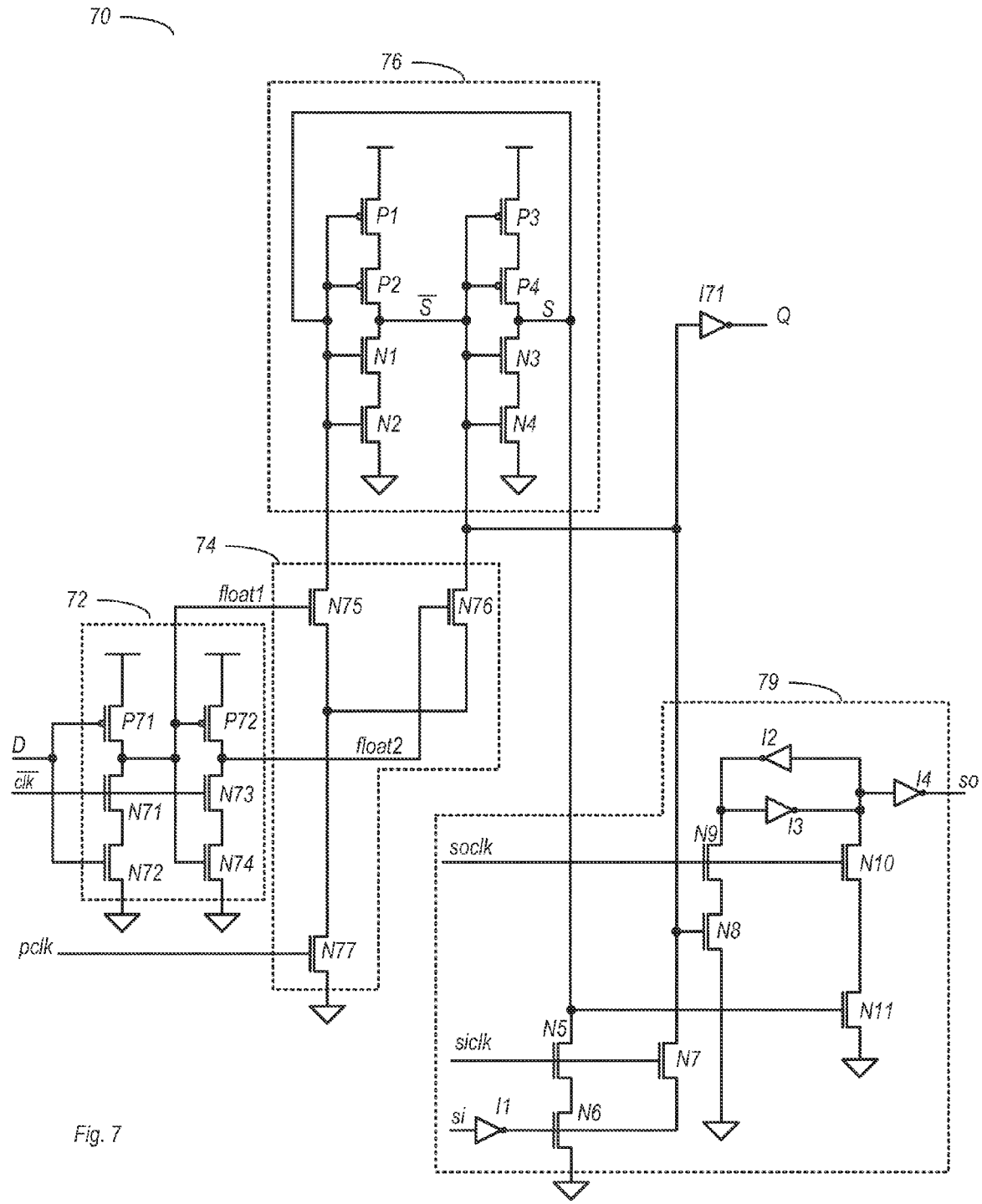
FIG. 7 is a schematic diagram of another embodiment of a pulse flop circuit.

Pulse Flop Circuit Embodiments and Operation:

FIGS. 3, 5, and 7 each illustrate a different embodiment of a pulse flop circuit. FIGS. 4, 6, and 8 each illustrate the timing relationships of FIGS. 3, 5, and 7, respectively. Each of the pulse flop circuits illustrated may operate in accordance with a pulse clock, and the latter two embodiments are configured to operate in accordance with a 50% duty cycle clock. Furthermore, each of the circuit embodiments to be discussed herein is configured to prevent the min-time problem. More particularly, each of the circuit embodiments to be discussed is arranged such that it is not fully transparent between its respective input and output nodes during operation, while still providing the functionality of a pulse flop. Accordingly, the various pulse flop embodiments discussed herein may be useful in applications requiring fast signal transmission (and thus, where a master-slave flip-flop would be unsuitable) while providing the ability to prevent the state of a signal to race through two or more series-coupled pulse flop circuits.

It is noted in the various circuit embodiments illustrated that transistors designated with a 'P' are PMOS transistors, while transistors designated with an 'N' are NMOS transistors. It is noted however that the arrangements of PMOS and NMOS transistors in these embodiments are exemplary, and thus other arrangements are possible and contemplated.

Turning now to FIG. 3, a schematic diagram of one embodiment of a pulse flop circuit is illustrated. Pulse flop 30 in the embodiment shown is configured to operate according to the pulse clock, pclk, but does not require a 50% duty cycle clock. In the embodiment shown, input circuit 32 and transfer circuit 33 are both coupled to receive the pulse clock, but function based on the opposite states thereof.

Input circuit 32 in the embodiment shown includes two series-coupled gated inverters. A first gated inverter is coupled to receive the data input, D, and includes transistors P31, P32, and N31. The second gate inverter includes P33, P34, and N32. Transistors P32 and P34 are arranged to provide a gating function for their respective inverters. When pclk is low, transistors P32 and P34 are active. Accordingly, when pclk is low, the first gated inverter may provide a complement of the input D, $\overline{D}$ on the first float node, float1, while the logical equivalent of D is provided on the second float node, float2.

When pclk transitions high, a pull-up path for at least one of the gate inverters will be blocked. For example, if D is low, float1 will be pulled high toward Vdd through P31 and P32 when pclk is low. However, when pclk transitions high, P32 is deactivated, and thus the pull-up path is blocked. Furthermore, since P32 is inactive when pclk is high and N31 is inactive when D is low, a high pclk with a low on D results in a situation where the first float node, float1, is not driven by any device and thus the voltage thereon is floating. A high voltage present on float1 at the time when pclk transitions high may be held capacitively for a time, and may be sufficient to cause the activation of N32 and N34 (the latter being part of transfer circuit 34). In one embodiment, the length of the active portion of the pulse clock (e.g., high in this case) may be timed such that float1 may hold a high voltage to activate N32 and N34 may remain active throughout.

A high on the D input when pclk is low may activate N31 and thus pull float1 low. The low on float1 may in turn activate P33, and thus float2 may be pulled high through P33 and P34. Float1 may remain driven after pclk transitions high, as the pull-down path remains through N31. However, when pclk transitions high, P34 is deactivated, thereby removing the pull-up path between float2 and Vdd. Accordingly, a floating voltage may be present on float2, and this voltage may be held capacitively for a time. However, as noted above, the pulse width may be selected as such to allow float2 to remain high long enough that N35 (of transfer circuit 34) is active throughout the active portion of the pulse.

As noted previously, transfer circuit 34 includes devices N34 and N35, and also includes N33. Depending on the input data received by input circuit 32 on node D, one of transistors N34 and N35 may be active at a given time. When pclk is low, N33 is inactive. However, when pclk transitions high in this embodiment, N33 is activated, thereby providing a pull-down path through itself and the active one of N34 and N35. If N34 is active concurrent with N33, node S of storage circuit 36 is pulled low through those devices. Node $\overline{S}$ is pulled low through N33 and N35 when those devices are concurrently active.

Storage circuit 36 in the embodiment shown includes a pair of cross-coupled inverters. The first of these inverters includes pull-up devices P1 and P2 along with pull-down devices N1 and N2. The second of these inverters includes pull-up devices P3 and P4 along with pull-down devices N3 and N4. The first of the inverters is coupled to node S as an input and is configured to drive an output on node $\overline{S}$. The second inverter is coupled to node $\overline{S}$ as an input, and is coupled to drive node S as an output.

It is noted that devices N33, and N34, and N35 of transfer circuit 34 are sized such that when either of the latter two is concurrently active with the former, the collective drive strength is sufficient to override either of the inverters of storage circuit 36. Thus when N33 and N34 are both active, the output of the second inverter, node S, may be pulled low even if the second inverter is attempting to drive node S high. This may thus cause the state of storage circuit 36 to flip, as the first inverter may respond by driving node $\overline{S}$ high, thus resulting in the second inverter switching to drive node S low. Similarly, when devices N33 and N35 are both active, the output node of the first inverter, $\overline{S}$, may be pulled low even when the first inverter is attempting to drive this node high. As a result, the second inverter may switch to begin driving node S high, thereby causing the first inverter to drive node $\overline{S}$ low.

In the embodiment shown, an output circuit is implemented using inverter I31. In this particular example, the input of I31 is coupled to node S, while the output provided on node $\overline{Q}$ is a complement of the input provided on node D. It is noted however that embodiments where the input node of I31 is coupled to node $\overline{S}$ (and thus a logical equivalent of the input is provided on the output) are possible and contemplated. Furthermore, embodiments having output circuits utilizing other arrangements (e.g., two inverters coupled in series) are also possible and contemplated.

FIG. 4 is a timing diagram illustrating operation of the embodiment of the pulse flop circuit of FIG. 3. In the given example, just prior to pclk transitioning high, the input node D is high, as is float2, while float1 is low. When pclk transitions high, N33 is activated. Device N35 is also active at the time pclk transitions high due to the high on float2 at the time of the transition. Thus, with N33 and N35 concurrently active, $\overline{S}$ is pulled low through these devices, at (1), with S correspondingly being pulled high. The output node, $\overline{Q}$, also follows $\overline{S}$ low, although this response may be slightly delayed (such a delay is not depicted here for the sake of simplicity).

As depicted by the dashed lines at (2), float2 may float subsequent to the low-to-high transition of pclk. When pclk transitions high, P34 is deactivated. Accordingly, the pull-up path to Vdd through P33 and P34 is cut off due to the deactivation of P34. With N32 also inactive at this point, float2 is not driven by any device. Accordingly, the high present on float2 just prior to the low-to-high transition of pclk is held capacitively. Pulse flop 30 may be designed such that the amount of time pclk is high is short enough in duration that float2 may hold the voltage at least for a duration sufficient to hold N35 active and thus pull $\overline{S}$ low. In some embodiments, the circuit may be designed such that the float2 may hold its voltage capacitively throughout the high portion of pclk. Float2 is again pulled high after pclk falls low, as P34 is once again active and the pull-up path through this device and P33 is restored.

It is also noted that when pclk is high, pulse flop 30 is not transparent. This is due to the resulting deactivation of P32 and P34. Thus, even if D were to fall low when pclk is high, the state of transfer circuit 34 would not change since the resulting deactivation of P32 would block the pull-up path between float1 and Vdd (through P31 and P32).

Subsequent to pclk falling low in this example, the data on node D also falls low due to new input data. When D falls low, N31 is deactivated and P31 is activated. With pclk low, float1 is pulled high through active devices P31 and P32. The high on float1 is received at the gate of N32, which is also activated and thus causes float2 to be pulled low. The high on float1 is also received at the gate terminal of N34. When pclk transitions high again, both N34 and N33 are concurrently active. Accordingly, node S is pulled low, at (3). Node $\overline{S}$ correspondingly is pulled high due to node S being pulled low.

As depicted by the dashed line at (4), float1 is not driven any device when pclk is high during this state. This is due to the deactivation of P32 when pclk is high, which blocks the pull-up path between float1 and Vdd. Since N31 is also inactive due to the low on input node D, float1 is not driven. The high on float1 just prior to the low-to-high transition may thus be held capacitively for a time that is sufficient to hold N34 active and thus pull node S low (if not for the entire duration of the high phase of pclk).

Returning to FIG. 3, pulse flop 30 in the embodiment shown includes a scan element 39, which may be used to enable scan testing of pulse flop 30, as well as other circuitry coupled to other scan elements. Scan element 39 may be one of a serially coupled chain of scan elements. Moreover, scan element 39 may be used to input test stimulus data to and capture test result data from storage circuit 36. Furthermore, scan data may be shifted through scan element 39 during scan shift operations in which test stimulus data is loaded or test result data is unloaded.

Scan element 39 includes a scan input (si) through which data is received during scan shift operations. The scan input data may be received by inverter I1, which may be implemented with a PMOS pull-up device and an NMOS pull-down device, each having gate terminals coupled to node si. Test stimulus data may be loaded into storage circuit 36 by scan element 39 when the scan input clock (siclk) is asserted, (and thus devices N5 and N7 are active).

If the scan input data is high, inverter I1 outputs a low, and N6 is inactive. Node $\overline{S}$ may be pulled low when both the scan input data and the scan input clock are high, through transistor N7 (which is active when the scan input clock is high) and the NMOS device of inverter I1.

If the scan input data is low, inverter I1 outputs a high. The high output from inverter I1 activates N6, while N5 is high when the scan input clock is high. Accordingly, node S is pulled low. Node $\overline{S}$ is pulled high in this situation through P1, P2, N1 and N2 of storage circuit 36.

Scan output data may be provided on node (so) when the scan clock (soclk) is high. If $\overline{S}$ is high concurrent with a high on the scan output clock node, both N8 and N9 are active, and scan data output node is driven low (via series coupled I3 and I4). If S is high concurrent with a high on the scan input clock node, devices N10 and N11 are concurrently active, and the scan data output node is driven high via inverter I4.

FIG. 5 is a schematic diagram of another embodiment of a pulse flop circuit. It is noted that in this embodiment, storage circuit 56 and scan element 59 are arranged in a manner similar to their counterparts shown in FIG. 3, and thus are not discussed in further detail. Furthermore, pulse flop 50 in the embodiment shown implements an output circuit using inverter I53. It is noted however that other output circuit embodiments are possible and contemplated, such as those alternate embodiments discussed above with reference to pulse flop 30.

In the embodiment shown in FIG. 5, pulse flop 50 includes an input circuit 52 having an input node $\overline{D}$ and further coupled to receive a complementary clock signal, $\overline{clk}$. The complementary clock signal $\overline{clk}$ may be a 50% duty cycle signal that is of opposite phase of a clock signal that is distributed to other circuitry in an IC in which pulse flop 50 is implemented.

Both the input $\overline{D}$ and complementary clock signal $\overline{clk}$ are received by a gated inverter I51 in the embodiment shown. Although not explicitly shown here, gated inverter I51 may include at least one PMOS pull-up device, and at least one NMOS pull-down device, each having respective gate terminals coupled to $\overline{D}$, with one or more additional gating devices having respective gate terminals to $\overline{clk}$. Thus, when $\overline{clk}$ is high, inverter I51 may drive float1 according to the logic level of an input signal received on $\overline{D}$. When $\overline{clk}$ is low, I51 may inhibit a change of state on float1 even if a change occurs on $\overline{D}$.

Transfer circuit 54 in the embodiment shown includes devices N51, N52, and N53, along with inverter I52 (which may be a standard inverter including a PMOS pull-up device and an NMOS pull-down device). Float1 is coupled to the gate terminal of N51 and the input of I52, while the output of I52 is coupled to the gate terminal of N53. The gate terminal of N52 is coupled to pclk, and is thus active when the pulse clock is high. Transfer circuit 54 may transfer a logic state received by input circuit 52 by providing a pull-down path for node S (through N51 and N52) or for node $\overline{S}$ (through N53 and N52).

The operation of pulse flop 50 is further illustrated by the timing diagram of FIG. 6. When $\overline{clk}$ is high, a high-to-low transition on $\overline{D}$ results in float1 transitioning high, and float2 falling low responsive thereto. When the clock signal (clk) transitions high, and thus $\overline{clk}$ falls low, float1 ceases to be driven by inverter I51, as depicted by the dashed lines at (1). The high on float1 may be held capacitively once it is no longer driven by I51 in a manner similar to that described above for the float nodes of pulse flop 30. At a time subsequent to $\overline{clk}$ falling low, pclk transitions high. Due to the low-to-high transition of pclk, both N51 and N52 are concurrently active at this time, and thus node S is pulled low at (2), with $\overline{S}$ being driven high as a result thereof. Float1 continues to float until $\overline{clk}$ transitions high again.

At a point subsequent to $\overline{clk}$ transitioning high, the input signal on $\overline{D}$ transitions high in the example shown. Accordingly, float1 falls low while float2 is driven high by I52. When $\overline{clk}$ subsequently falls low again, float1 is again no longer driven by any device, and thus floats low at (3). However, the output of inverter I52 may remain high as long as the voltage on float1 remains sufficiently low. The subsequent low-to-high transition of pclk results in the activation of N52. Thus, with N53 and N52 concurrently active, $\overline{S}$ is pulled low through these devices, at (4), with S being driven high responsive to the state change of $\overline{S}$.

FIG. 7 is a schematic diagram of another embodiment of a pulse flop circuit. Transfer circuit 74, storage circuit 76, and scan element 79 of pulse flop 70 are arranged in a manner similar to their counterparts of pulse flop 30 shown in FIG. 3, and may thus operate in a similar manner.

Input circuit 72 in the embodiment shown, includes two gated inverters coupled in series. The first of these inverters includes devices P71, N71, and N72. The second of these inverters includes P72, N73, and N74. The gate terminals of devices N71 and N73 are each coupled to node $\overline{clk}$, and may thus enable or block a pull-down path for their respective inverters. The operation of pulse flop 70 will now be explained in with reference to the timing diagram in FIG. 8.

The timing diagram shown in FIG. 8 begins with a high on node D, which subsequently falls low. Node $\overline{clk}$ is high at this point, and thus N71 and N73 are both active. As a result of D falling low, P71 is activated and thus float1 is pulled high. The high on float1 is received by the gate terminal of N74, which activates. Thus, float2 is pulled low.

When $\overline{clk}$ falls low, both N71 and N73 are deactivated. Float1 remains pulled high at this point, as the pull-up path through P71 is not blocked. However, the pull-down path from float2 to ground is blocked when N73 is deactivated. Since P72 is also inactive at this point, float2 is not driven by any device, and thus floats low, as depicted by the dashed lines at (1). When pclk subsequently rises, node S is pulled low through concurrently active devices N75 and N77 at (2). Node $\overline{S}$ is pulled high at this point as a result of node S being pulled low. After $\overline{clk}$ transitions high again, the pull-down path though N73 and N74 is restored, and float2 is again driven low.

In the example shown, D transitions high subsequent to pclk falling low and $\overline{clk}$ transitioning high again. When $\overline{clk}$ falls low again, the pull down path between float1 and ground is blocked by the deactivation of N71. Since P71 is also inactive (due to the high on D), float1 is thus not driven by any device at this point, and thus floats low as shown at (3). Float2 may remain high if the voltage on float1 remains sufficiently low to ensure that P72 remains active. Accordingly, the high on float2 may activate N76. When pclk subsequently transitions high, N77 is activated. Accordingly, $\overline{S}$ is pulled low through N76 and N77 at (4), with S being driven high as a result thereof.

It is noted circuit embodiments other than those discussed above are illustrative, and other embodiments are possible and contemplated. Generally speaking, any circuit that functions according to the descriptions given above may fall within the scope of this disclosure.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A flop circuit comprising:
an input circuit having an input node, wherein the input circuit is configured to hold a logic value of an input signal received on the input node;
a storage circuit configured to, responsive to a pulse clock transitioning to a first logic level, receive and store the logic value and a complement of the logic value; and
a transfer circuit coupled between the input circuit and the storage circuit, wherein the transfer circuit is configured to transfer the logic value from the input circuit to the storage circuit responsive to the pulse clock transitioning to the first logic level;
wherein the transfer circuit includes a first float node and a second float node and is configured such that at least one of the float nodes is floating during a portion of the operational cycle of the flop circuit, and
wherein the transfer circuit includes a first transistor having a gate terminal coupled to the first float node, a second transistor having a gate terminal coupled to the second float node, and a third transistor having a gate terminal coupled to receive the clock pulse, wherein the third transistor is coupled between a reference node and each of the first and second transistors.

2. The flop circuit as recited in claim 1, wherein the input circuit is coupled to the first float node and the second float node.

3. The flop circuit as recited in claim 2, wherein the input circuit is coupled to receive the pulse clock, and wherein the input circuit is configured to, when the pulse clock is at a second logic level, to provide the complement of the logic value to the first float node and provide the logic value to the second float node.

4. The flop circuit as recited in claim 3, wherein the input circuit is configured to cause the first float node to float when the pulse clock is at the first logic level concurrent with the input signal being at the second logic level, and wherein the input circuit is further configured to cause the second float node to float when the pulse clock is at the first logic level concurrent with the first float node being at the second logic level.

5. The flop circuit as recited in claim 1, wherein the input circuit includes a first gated inverter coupled to receive the input signal and a complement of a clock signal, the clock signal having a 50% duty cycle.

6. The flop circuit as recited in claim 5, wherein the first gated inverter is configured to propagate a complement of the input signal to the first float node when the complement of the clock signal is at the first logic level.

7. The flop circuit as recited in claim 6, wherein the transfer circuit is configured to transfer the logic value from the input circuit to the storage circuit when the pulse clock is at the first logic level and when the complement of the clock signal is at a second logic level.

8. The flop circuit as recited in claim 7, wherein the first gated inverter is configured to cause the first float node to float when the complement of the clock signal is at the second logic level.

9. The flop circuit as recited in claim 5, wherein the input circuit further includes a second gated inverter coupled to receive the complement of the clock signal, wherein, when the complement of the clock signal is at the first logic level, the first gated inverter is configured to drive a first signal that is a complement of the logic value onto the first float node and a second signal that is logically equivalent to the input signal onto the second float node.

10. The flop circuit as recited in claim 9, wherein the input circuit is configured to cause the first float node to float when the complement of the clock signal is at a second logic level concurrent with the input signal being at the first logic level, and wherein the input circuit is further configured to cause the second float node to float when the complement of the clock signal is at the second logic level concurrent with the first float node being at the first logic level.

11. The flop circuit as recited in claim 1, wherein the flop circuit further includes an output circuit coupled to the storage circuit, wherein the output circuit is configured to provide an output signal at a logic value that is complementary of that of the input signal.

12. The flop circuit as recited in claim 1, wherein the flop circuit further includes an output circuit coupled to the storage circuit, wherein the output circuit is configured to provide an output signal at the logic value of the input signal.

13. An integrated circuit comprising:
first and second logic units each having one or more combinational logic circuits; and
a flop circuit coupled between the first and second logic units, wherein the flop circuit is coupled to receive a first signal from the first logic unit and is configured to provide a second signal to the second logic in accordance with a pulse clock, wherein the flop circuit includes:
an input circuit having an input node coupled to receive the first signal, wherein the input circuit is configured to hold a logic value of the first signal;
a storage circuit configured to, responsive to the pulse clock transitioning to a first logic level, receive and store the logic value of the first signal and a complement of the logic value of the first signal; and
a transfer circuit coupled between the input circuit and the storage circuit, wherein the transfer circuit is configured to transfer the logic value of the first signal from the input circuit to the storage circuit responsive to the pulse clock transitioning to the first logic level;
wherein the transfer circuit includes a first float node and a second float node and is configured such that at least one of the float nodes is floating during a portion of the operational cycle of the flop circuit; and
wherein the transfer circuit includes a first transistor having a gate terminal coupled to the first float node, a second transistor having a gate terminal coupled to the second float node, and a third transistor having a gate terminal coupled to receive the clock pulse, wherein the third transistor is coupled between a reference node and each of the first and second transistors.

14. The integrated circuit as recited in claim 13, wherein the input circuit is coupled to the first float node and the second float node, wherein the input circuit is coupled to receive the pulse clock, and wherein the input circuit is configured to, when the pulse clock is at a second logic level, to provide the complement of the logic value of the first signal to the first float node and provide an equivalent of the logic value of the first signal to the second float node.

15. The integrated circuit as recited in claim 14, wherein the input circuit is configured to cause the first float node to float when the pulse clock is at the first logic value concurrent with the first signal being at the second logic level, and wherein the input circuit is further configured to cause the second float node to float when the pulse clock is at the first logic value concurrent with the first float node being at the second logic level.

16. The integrated circuit as recited in claim 13, wherein the input circuit includes a first gated inverter coupled to receive the first signal and a complement of a clock signal, the clock signal having a 50% duty cycle, wherein the first gated inverter is configured to propagate a complement of the input signal to the first float node when the complement of the clock signal is at the first logic level, and wherein the transfer circuit is configured to transfer the logic value from the input circuit to the storage circuit when the pulse clock is at the first logic level and when the complement of the clock signal is at a second logic level.

17. The integrated circuit as recited in claim 16, wherein the first gated inverter is configured to cause the first float node to float when the complement of the clock signal is at the second logic level.

18. The integrated circuit as recited in claim 16, wherein the input circuit further includes a second gated inverter coupled to receive the complement of the clock signal, wherein, when the complement of the clock signal is at the first logic level, the first gated inverter is configured to drive the first float node to a logic value that is a complement of that of the first signal and wherein the second gated inverter is configured to drive the second float node to a logic value that is logically equivalent to that of the first input signal.

19. The integrated circuit as recited in claim 18, wherein the input circuit is configured to cause the first float node to float when the complement of the clock signal is at a second logic level concurrent with the first signal being at the first logic level, and wherein the input circuit is further configured to cause the second float node to float when the complement of the clock signal is at the second logic level concurrent with the first float node being at the first logic level.

20. The integrated circuit as recited in claim 13, wherein the flop circuit further includes an output circuit coupled to the storage circuit, wherein the output circuit is configured to provide the second signal at the logic value of the first signal.

\* \* \* \* \*

UNITED STATES PATENT AND TRADEMARK OFFICE
CERTIFICATE OF CORRECTION

PATENT NO. : 8,436,668 B2  
APPLICATION NO. : 12/984174  
DATED : May 7, 2013  
INVENTOR(S) : Masleid et al.

Page 1 of 1

It is certified that error appears in the above-identified patent and that said Letters Patent is hereby corrected as shown below:

In the Specifications:

In column 8, line 4, delete "clksubsequently" and insert -- clk subsequently --, therefor.

Signed and Sealed this  
Third Day of September, 2013

Teresa Stanek Rea  
*Acting Director of the United States Patent and Trademark Office*